(12) United States Patent
Peng et al.

(10) Patent No.: US 8,510,683 B2
(45) Date of Patent: Aug. 13, 2013

(54) SPATIAL MAP OF MASK-PATTERN DEFECTS

(75) Inventors: Jun Peng, Beijing (CN); Guoqiang Bai, Beijing (CN); Xin Zhou, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/313,957

(22) Filed: Dec. 7, 2011

(65) Prior Publication Data

US 2013/0152026 A1    Jun. 13, 2013

(51) Int. Cl.
*G06F 17/50*    (2006.01)
(52) U.S. Cl.
USPC .............................................. 716/52; 716/51
(58) Field of Classification Search
USPC ..................................................... 716/50–54
See application file for complete search history.

(56) References Cited

U.S. PATENT DOCUMENTS

| | | | |
|---|---|---|---|
| 7,921,383 B1* | 4/2011 | Wei ................................. | 716/54 |
| 2003/0228532 A1* | 12/2003 | Mui et al. ........................ | 430/30 |
| 2005/0240895 A1* | 10/2005 | Smith et al. ..................... | 716/19 |
| 2006/0051681 A1* | 3/2006 | Taylor .............................. | 430/5 |
| 2007/0011647 A1* | 1/2007 | Abrams et al. .................. | 716/21 |

* cited by examiner

*Primary Examiner* — Binh Tat
(74) *Attorney, Agent, or Firm* — Fenwick & West LLP

(57) ABSTRACT

A technique for providing information about defects in a mask pattern is described. In this technique, defects in the mask pattern may be determined based on differences between a calculated pattern produced at an image plane in the photolithographic process, when the mask pattern, illuminated by an associated source pattern, is at an object plane in the photolithographic process, and a target pattern that excludes the defects. Then the defect information may be provided to the user, such as a spatial map of the determined defects, where the spatial map is associated with at least the portion of the mask pattern.

17 Claims, 8 Drawing Sheets

SPATIAL MAP OF MASK-PATTERN DEFECTS

CROSS REFERENCE TO RELATED APPLICATIONS

This application is related to U.S. Non-provisional patent application Ser. No. 13/297,016, entitled "OPC Checking and Classification," by Guoquiang Bai et al., filed on Nov. 15, 2011, the contents of which are hereby incorporated by reference.

BACKGROUND

1. Field

The present invention relates to systems and techniques for verifying mask patterns.

2. Related Art

Lithography processing represents an essential technology for manufacturing Integrated Circuits and Micro-Electro-Mechanical Systems (MEMS) and Nano-Electro-Mechanical Systems (NEMS). Lithographic techniques are used to define: patterns, geometries, features, shapes, etc. onto an integrated-circuit die, semiconductor wafer, or chips. These patterns are typically defined by: a set of contours, lines, boundaries, edges, curves, etc., which generally surround, enclose, and/or define the boundary of the various regions which constitute the patterns.

One existing lithographic technique is photolithography, in which images defined by photo-masks are printed onto an integrated-circuit die or one or more semiconductor wafers. Unfortunately, it is increasingly difficult to design and manufacture photo-masks.

In particular, demand for increased density of features on the integrated-circuit die and the one or more semiconductor wafers has resulted in the design of circuits with decreasing minimum dimensions. These trends have significantly increased the complexity of the computations necessary to determine the mask patterns (to which the photo-masks correspond), with a commensurate impact on computation time, processing requirements, and expense.

Furthermore, due to the wave nature of light, as dimensions approach sizes comparable to the wavelength of the light used in the photolithography processes, the resulting wafer patterns deviate from the corresponding photo-mask patterns and are accompanied by unwanted distortions and artifacts. Existing techniques (such as Optical Proximity Correction or OPC, and Resolution Enhancement Technologies or RED are used to pre-distort the mask patterns to improve resolution and/or a process window (e.g., a range of process conditions that result in acceptable yield) in a photolithography process. While these techniques may ensure that the wafer pattern is printed more accurately, determining the pre-distorted mask patterns is increasingly difficult, thereby exacerbating the computational complexity and the associated problems.

Additionally, it is also increasingly difficult to verify that the resulting mask patterns meet predefined design criteria. In particular, as the minimum dimensions of features in the mask patterns are reduced and the complexity of the mask patterns is increased, differences or defects can occur between the wafer patterns produced using the mask pattern and desired target patterns. While some of these defects are more important than others, it is increasingly difficult to assess the relative importance of the defects.

Hence, what is needed is a method and an apparatus that facilitates verification of mask patterns without the above-described problems.

SUMMARY

The present disclosure relates to a computer system that provides a spatial map of defects in at least a portion of a mask pattern. During operation, the computer system may receive the mask pattern for use in a photolithographic process. Then, the computer system may calculate a pattern produced at an image plane in the photolithographic process when at least the portion of the mask pattern, illuminated by an associated source pattern, is at an object plane in the photolithographic process. Moreover, the computer system may determine the defects in at least the portion of the mask pattern based on differences between the calculated pattern and a target pattern, where the target pattern excludes the defects. Next, the computer system may provide a spatial map of the determined defects, where the spatial map is associated with at least the portion of the mask pattern.

Note that the spatial map may include a 2-dimensional map. Moreover, the spatial map may indicate the defect density.

In some embodiments, providing the spatial map involves providing an image of the spatial map. For example, providing the spatial map may involve presenting the image in a graphical user interface associated with mask-pattern analysis software.

Furthermore, the calculated pattern may include an aerial image. Alternatively or additionally, the calculated pattern may include a simulated wafer pattern based on a model of a photoresist used in the photolithographic process.

Another embodiment provides a method including at least some of the above-described operations performed by the computer system.

Another embodiment provides a computer-program product for use in conjunction with the computer system.

Another embodiment provides the graphical user interface associated with the mask-pattern analysis software. This graphical user interface may display a window that includes the spatial map.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings. Moreover, multiple instances of the same part are designated by a common prefix separated from an instance number by a dash.

DETAILED DESCRIPTION

Figure 1:
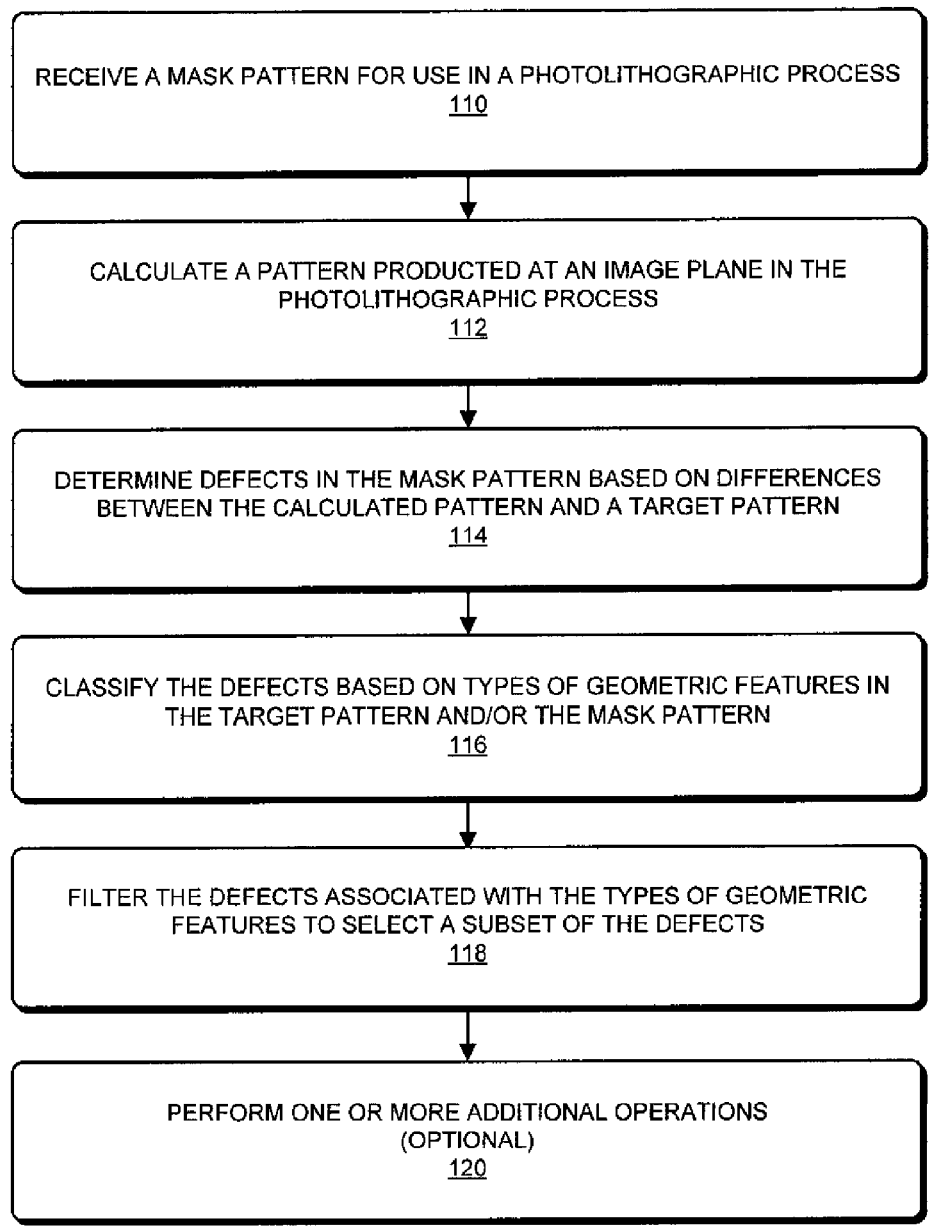
FIG. 1 is a flow chart illustrating a process for selecting a subset of determined defects in a mask pattern in accordance with an embodiment of the present disclosure.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer-program product (i.e., software) for use with the computer system are described. These devices and processes may be used to provide defect information to a user during the mask-pattern design process and/or so that an acceptance condition of the mask pattern can be determined. In particular, defects in the mask pattern may be determined based on differences between a calculated pattern produced at an image plane in the photolithographic process, when the mask pattern, illuminated by an associated source pattern, is at an object plane in the photolithographic process, and a target pattern that excludes the defects. Then the defect information may be provided to the user, such as a spatial map of the determined defects, where the spatial map is associated with at least the portion of the mask pattern.

By providing the defect information, this verification technique may allow the defects that have the largest negative impact in the photolithographic process to be identified. These defects may be: corrected in the mask-pattern design process, repaired in a manufactured photo-mask (which corresponds to the mask pattern) and/or excluded (i.e., if the photo-mask includes one of these defects, it may not be used in the photolithographic process). Thus, the verification technique may increase manufacturing yield with a commensurate impact on the cost of wafer produced in the photolithographic process.

In the discussion that follows, a photo-mask should be understood to include: a chromium-on-glass photo-mask, an alternating phase-shifting photo-mask, an attenuating phase-shifting photo-mask, and/or multiple-exposure photo-masks (e.g., where patterns printed on a wafer or semiconductor die using two or more photo-masks are combined to produce a desired or target pattern, such as a portion of an integrated circuit). Furthermore, a mask pattern should be understood to include the pattern of spatially varying transmittance magnitude and/or transmittance phase in a given photo-mask. Note that, typically, the manufactured or fabricated mask pattern in a given photo-mask deviates from an ideal target mask pattern, for example, because of defects that can occur during the photo-mask fabrication process.

In addition, in the discussion that follows note that an image and/or a pattern may include a bitmap or grayscale file that includes a set of values corresponding to pixels in the image and/or the pattern. Furthermore, the quantization (i.e., the number of bits) in these files may be varied, as needed, during the measurements and calculations that are described. Alternative formats having the same or similar information content, including a vector-based format such as a Graphic Design System II (GDSII) and/or an OASIS format, may be used in some embodiments of the images and/or patterns. And in some embodiments, the images and/or patterns include real and imaginary components (or equivalently, magnitude and phase information).

We now describe embodiments of the verification technique. FIG. 1 presents a flow chart illustrating a method 100 for selecting a subset of determined defects in a mask pattern, which is performed by a computer system (such as computer system 700 in FIG. 7). During operation, the computer system may receive a mask pattern for use in a photolithographic process (operation 110). For example, the mask pattern may have been determined using a design tool. Then, the computer system may calculate a pattern produced at an image plane in the photolithographic process (operation 112) when the mask pattern, illuminated by an associated source pattern, is at an object plane in the photolithographic process. For example, the calculated pattern may include an aerial image. Alternatively or additionally, the calculated pattern may include a simulated wafer pattern based on a model of a photoresist used in the photolithographic process. Note that the calculated pattern may be determined using a forward optical calculation with the illuminated mask pattern at an object plane of an optical path associated with the photolithographic process (such as the optical path of an exposure tool) and with the calculated pattern at an image plane of the optical path.

Moreover, the computer system may determine the defects in the mask pattern based on differences between the calculated pattern and a target pattern (operation 114) that excludes the defects.

Next, the computer system may classify the defects by associating the defects with types of geometric features in the target pattern and/or the mask pattern (operation 116). Note that the types of geometric features may include topological markers. For example, the types of geometric features may include: an inner corner, an outer corner, a corner, a line end, a space, a jog, and/or a straight edge.

Furthermore, the computer system may filter the defects associated with the types of geometric features to select a subset of the defects (operation 118), where the subset includes defects corresponding to the differences that exceed filtering values that are associated with the types of geometric features.

In some embodiments, the computer system optionally performs one or more additional operations (operation 120). For example, the computer system may optionally provide a list of the subset of defects and the associated classifications.

In response to providing the list, the computer system may optionally receive a revised value of at least one of the filtering values from a user of the computer system.

Alternatively or additionally, after filtering the defects (operation 118), the computer system may optionally determine an acceptance condition of the mask pattern. For example, the acceptance condition may include a pass or a fail condition. Moreover, determining the acceptance condition may involve accessing predetermined acceptable ranges of the differences, which are stored in a computer-readable memory.

Note that, in some embodiments, instead of calculating the pattern produced at the image plane in the photolithographic process, the computer system may use an image of a wafer pattern produced in the photolithographic process when determining the differences and, thus, the defects.

Figure 2:
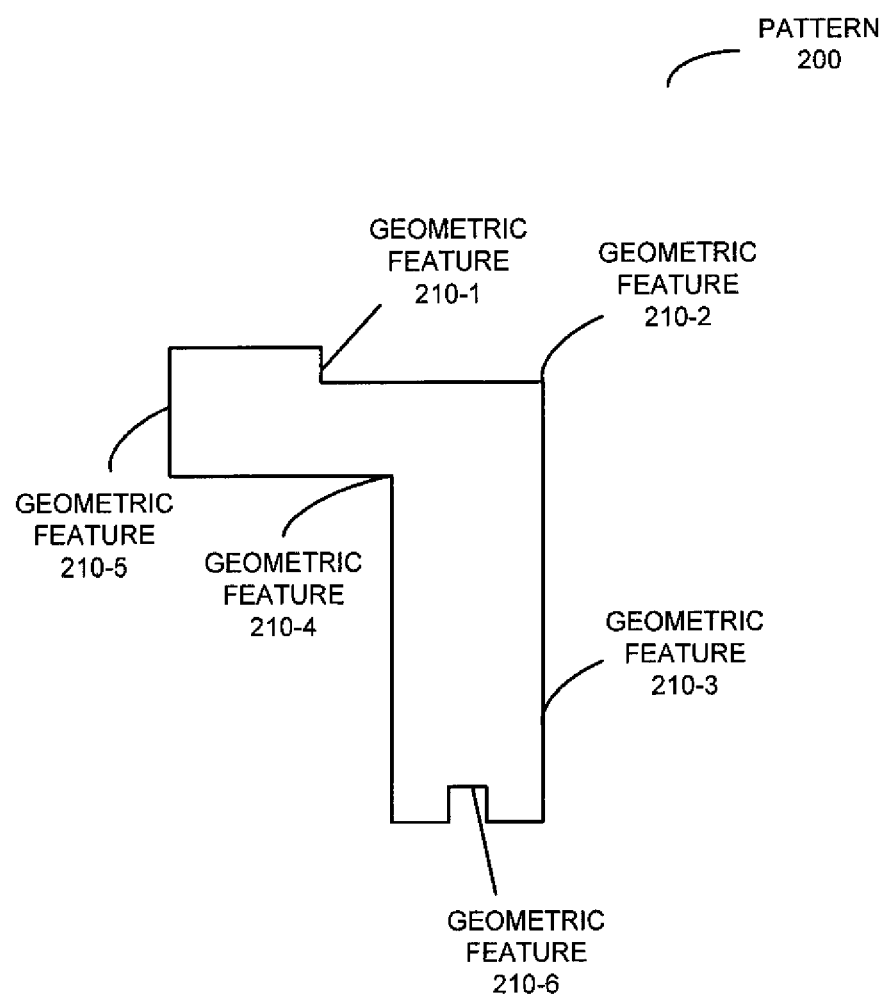
FIG. 2 is a block diagram illustrating geometric features in a pattern, such as a mask pattern or a target pattern, in accordance with an embodiment of the present disclosure.

FIG. 2 presents a block diagram illustrating geometric features 210 in a pattern 200, such as a mask pattern or a target pattern. For example, geometric features 210 may include topological markers that are identified in a polygon representation of pattern 200, such as corners (such as inner or concave corners, or outer or convex corners), jogs, straight regions (such as smooth lines or smooth edges), line ends, t-shaped intersections, space ends (such as geometric feature 210-6), holes (such as hole edges, hole jogs, hole inner corners or hole outer corners), etc.

In an exemplary embodiment, a jog (such as geometric feature 210-1) may be less than 5 nm and the associated filtering of defects may occur within ±10 nm of a given jog. Similarly, at line ends, a defect may be associated with actual line width less than a minimum value (such as 60 or 150 nm) and/or a difference in the line-end position more than a minimum value (such as 75 or 100 nm). The line-end filtering of defects may occur within ±4 nm of a given line end. In general, defects may include: an extra feature, a missing feature, a pinched feature, a bridge between features, a feature less than a minimum area, hole shrinkage, hole expansion, hole misplacement, line-end shortening, line-end push out, space-end shortening, space-end push out, a critical-dimension variation, critical-dimension uniformity, edge placement error, a hole-overlap check, a hole-distance check, and/or a double-patterning check. One or more of these defects may change as a function of the light-intensity or dose.

By classifying defects in a mask pattern by associating the defects with geometric features 210, the verification technique may be used to filter the defects and, thus, to select the subset of defects. For example, there may be a large number of small defects associated with line ends. If the classification information is presented to a user of the computer system (such as a mask designer) along with the associated defects, the user may adjust a filtering value associated with this type of geometric defect. Using this filtering value, defects corresponding to differences less than the filtering value may be excluded. For example, differences less than 5% of a critical dimension in pattern 200 that are associated with line ends may be excluded. This filtering process can be repeated for different types of geometric defects, which may allow the user to specify geometric-defect-specific filtering values. In this way, the user can focus on the more important (in this case, the larger) differences by selecting the subset of the defects. In addition, by facilitating geometric-defect-specific filter, this verification technique may assist the user in identifying geometric-defect-related trends in the defects, which may facilitate corrective action when designing the mask pattern.

Figure 3:
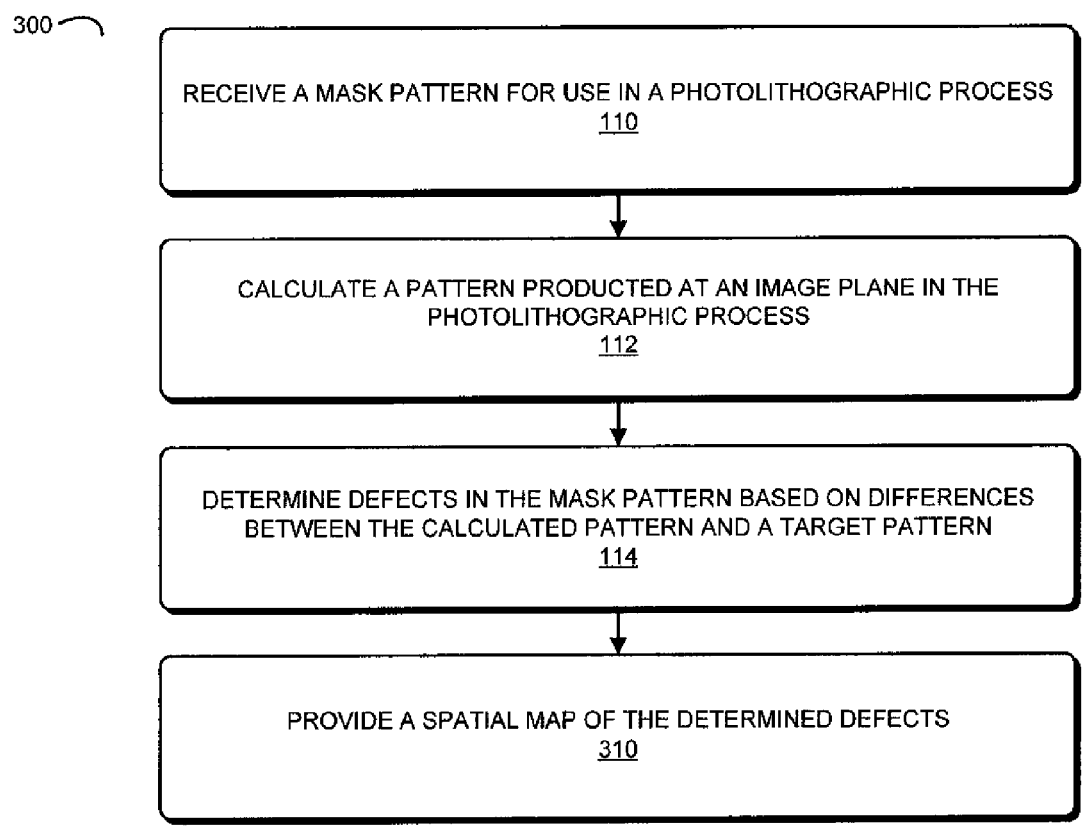
FIG. 3 is a flow chart illustrating a process for providing a spatial map of defects in at least a portion of a mask pattern in accordance with an embodiment of the present disclosure.

We now describe another embodiment of the verification technique. FIG. 3 presents a flow chart illustrating a method 300 for providing a spatial map of defects in at least a portion of a mask pattern, which is performed by a computer system (such as computer system 700 in FIG. 7). During operation, the computer system may receive the mask pattern for use in a photolithographic process (operation 110). Then, the computer system may calculate a pattern produced at an image plane in the photolithographic process (operation 112) when at least the portion of the mask pattern, illuminated by an associated source pattern, is at an object plane in the photolithographic process. Moreover, the computer system may determine the defects in at least the portion of the mask pattern based on differences between the calculated pattern and a target pattern (operation 114), where the target pattern excludes the defects. Next, the computer system may provide or display defect information (operation 310), such as a spatial map of the determined defects, where the spatial map is associated with at least the portion of the mask pattern.

Note that the spatial map may include a 2-dimensional map. Moreover, the spatial map may indicate the defect density.

In some embodiments, providing the spatial map involves providing an image of the spatial map. For example, providing the spatial map may involve presenting the image in a graphical user interface associated with mask-pattern analysis software.

Furthermore, the calculated pattern may include an aerial image. Alternatively or additionally, the calculated pattern may include a simulated wafer pattern based on a model of a photoresist used in the photolithographic process.

In some embodiments of methods 100 (FIG. 1) and/or 300 there may be additional or fewer operations. Moreover, the order of the operations may be changed, and/or two or more operations may be combined into a single operation.

Figure 4A:
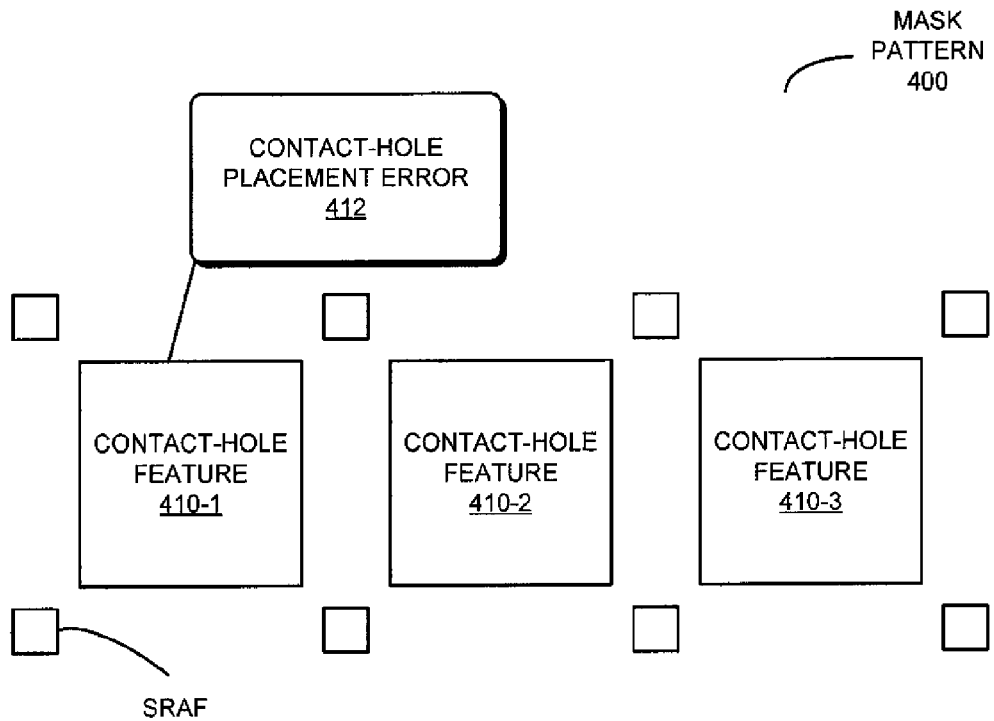
FIG. 4A is a drawing illustrating the display of a numerical value of a contact-hole misplacement error for one of the contact-hole features in a mask pattern in accordance with an embodiment of the present disclosure.

As shown in FIG. 4A, which presents a drawing illustrating display of a numerical value of a contact-hole misplacement error for one of contact-hole features 410 in a mask pattern 400, the defect information presented or provided by the computer system may include a contact-hole misplacement error 412 (which is the difference between the actual centroid location of a contact hole produced by one of contact-hole features 410 in mask pattern and a desired centroid location in a target pattern). This information may be provided instead of providing edge-placement errors to the user. Note that contact-hole misplacement error 412 may be the difference between the center of mass of a target hole and the center of mass of the image contour. This may assist the user when designing the mask pattern because the user will not have to infer contact-hole misplacement error 412 from the edge-placement errors. In some embodiments, contact-hole misplacement error 412 is displayed to a user in a graphical user interface, such as one associated with mask-pattern analysis software (e.g., mask-pattern inspection software).

Figure 4B:
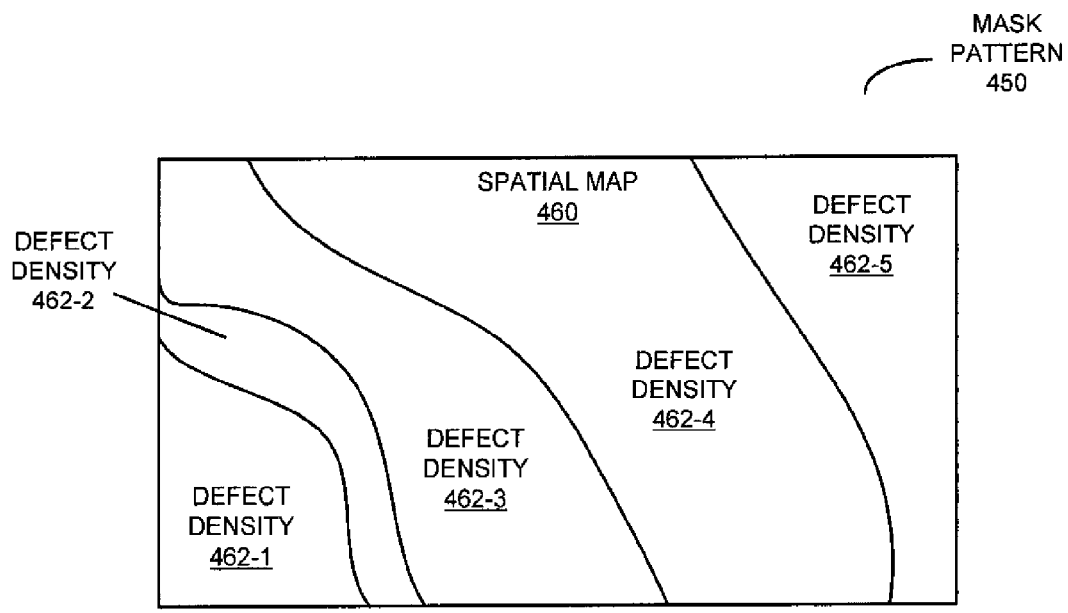
FIG. 4B is a drawing illustrating a spatial map of defects associated with a mask pattern in accordance with an embodiment of the present disclosure.

As shown in FIG. 4B, which presents a drawing illustrating a spatial map 460 of defects associated with a mask pattern 450, in some embodiments the defect information presented or provided by the computer system may include a global spatial map of defects that are presented to the user during design or verification of a mask pattern. Note that spatial map 460 may include colored markers and legends, such as contour lines reflecting defect densities 462, to assist the user in identifying spatial trends in the optical-proximity corrections. However, in other embodiments, instead of using contour lines, the defect density may be represented by the clustering of defect markers or symbols (which indicate defect locations and/or types of defects). For example, the defect markers may include types of defects such as: a missing image, a violation of a minimum area, a pinched feature, an edge placement error for an edge check, an edge placement error for a point check, and/or contact misplacement.

In some embodiments, defects are classified or binned based on the target pattern and the surrounding geometry. This may allow the same mirror and rotation operations to be performed on a common group or a type of defect so that they have the same orientation. Note that, without this classification technique, the mirror and rotation operations may be difficult to perform because the defects may occur in spatially separate locations and, in the absence of the classification, it may not be apparent that they should look the same and/or should be grouped together.

Figure 5:
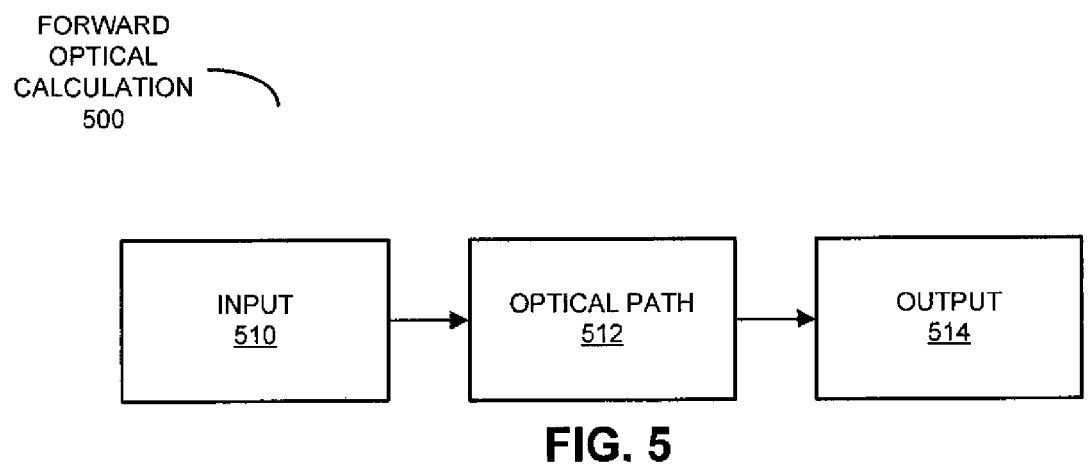
FIG. 5 is a block diagram illustrating a forward optical calculation in accordance with an embodiment of the present disclosure.

We now describe optical calculations that may be used when verifying a mask pattern. FIG. 5 presents a block diagram illustrating a forward optical calculation 500. In this calculation, a suitable illuminated input 510 (such as a pattern or an image) at an object plane of optical path 512 is used to determine a predicted output 514 (such as a pattern or an image) at an image plane of optical path 512. For example, using the determined mask pattern, a source pattern, and information about the optical path associated with the photolithographic process, the resulting wafer pattern can be determined. (As noted previously, the difference(s) between the wafer pattern, i.e., the estimated or calculated pattern, and the target pattern can be used to determine the cost function.) In general, information about optical path 512 may include some or all of the aspects of the photolithographic process, such as illumination settings, the electromagnetics of the photo-mask, the exposure-tool optics, etc. In addition, in some embodiments forward optical calculation 500 models the effect of a photoresist, including flare and/or etch effects.

Note that calculations corresponding to one or more optical paths in forward optical calculation 400 may be implemented using Fourier-optical techniques. Furthermore, the optical path in forward optical calculation 500 may include multiple models of optical paths (such as when there are different exposure tools used in multi-exposure photolithography). Also note that while optical path 512 has been traversed in particular directions, this optical path may be traversed in either direction.

We now describe an exemplary embodiment of the forward optical calculation or forward projection operation used to calculate the estimated pattern (i.e., the calculated pattern) at the image plane in the photolithographic process. For simplicity, coherent illumination of the photo-mask (which corresponds to the mask pattern) is utilized. Furthermore, the electric field falling upon the photo-mask is approximately constant. Thus, the clear regions of the photo-mask pass the light, while the opaque regions block the light. It follows that a scalar electric field E, just behind the photo-mask, may be expressed as $$E(\vec{r}) = \begin{Bmatrix} 0 & \text{chrome} \\ 1 & \text{glass} \end{Bmatrix},$$

where $\vec{r}=(x, y)$ is a point on the (x, y) plane. As discussed below with reference to FIG. 6, this representation of the photo-mask may be re-expressed using a function $\phi$ (referred to as a level-set function) having positive regions that indicate glass and negative regions that indicate chrome. Furthermore, the level-set function may equal zero at the boundaries or contours of the photo-mask. Therefore, the electric field E associated with the photo-mask may be re-expressed as a function of this level-set function, i.e., $$E(\vec{r}) = \hat{h}(\phi(x,y)),$$

where $\hat{h}$ is the Heaviside function $$\hat{h}(x) = \begin{Bmatrix} 1 & x \geq 0 \\ 0 & x < 0 \end{Bmatrix}.$$

Since an ideal diffraction limited lens acts as a low-pass filter, this may be used as an approximation to the actual (almost but not quite perfect) lens in the optical path in the photolithographic process (in this example). Mathematically, the action of the lens may be expressed as $$A(\vec{r}) = f^{-1}(\hat{C}(f(E(\vec{r}))))$$

where $A(\vec{r})$ indicates the electric field distribution on the wafer, f indicates the Fourier transform, $f_{-1}$ indicates the inverse Fourier transform, and $\hat{C}$ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \begin{Bmatrix} 0 & k_x^2 + k_y^2 \geq k_{max}^2 \\ 1 & k_x^2 + k_y^2 < k_{max}^2 \end{Bmatrix},$$

wherein $k_x$, $k_y$ and $k_{max}$ represent frequency coordinates in Fourier space. Therefore, the estimated pattern at the image plane in the photolithographic process is simply the square of the electric field $$I(\vec{r}) = |A(\vec{r})|^2.$$

Combining these two equations, we find $$F(\phi(x,y)) = (|f^{-1}\hat{C}(f(\hat{h}(\phi(x,y))))|^2).$$

This is a self-contained formula for the estimated pattern determined by when designing the mask pattern.

Note that this is just one embodiment of the forward projector that can be used within the scope of this disclosure, chosen by way of example due to its relative simplicity. More sophisticated forward models also fall within the scope of the present disclosure. Such models may take into account, by way of example but not limitation, various illumination conditions (e.g., off-axis, incoherent), the actual electromagnetics of the light field interacting with the photo-mask, various types of photo-masks other than chrome on glass (e.g., attenuated phase shifting, strong phase shifting, other materials, etc.), the polarization of the light field, the actual properties of the lens (such as aberrations), and/or the vector nature of the electromagnetic field as it propagates through the optical path.

Figure 6:
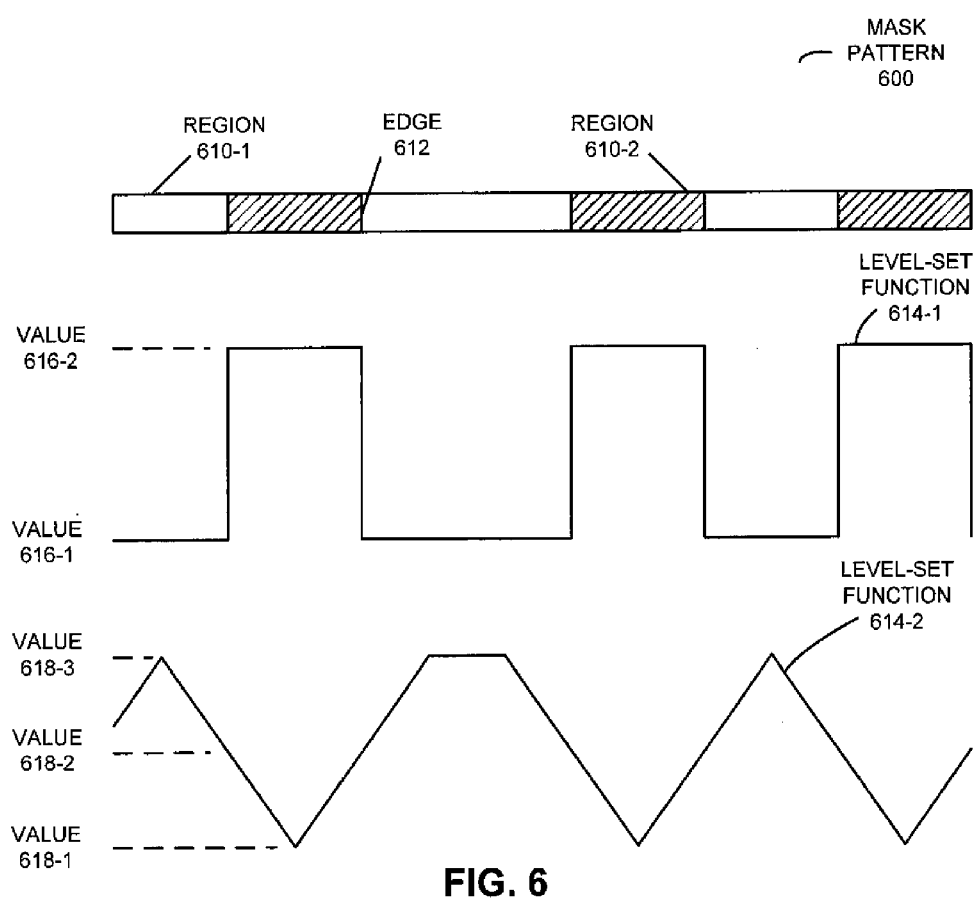
FIG. 6 is a block diagram illustrating a mask pattern and corresponding level-set functions in accordance with an embodiment of the present disclosure.

We now describe the level-set functions in more detail. As noted previously, the mask pattern may be represented as a function having a set of values that is larger than those in the actual photo-mask. In some embodiments, the function is a level-set function. This is illustrated in FIG. 6, which provides a mask pattern 600 and corresponding level-set functions 614. This mask pattern includes alternating regions with glass (610-1) and chromium (610-2). Transitions from one region to another are characterized by a contour or an edge, such as edge 612. When viewed from a direction perpendicular to a plane of the photo-mask, edge 612 defines mask pattern 600.

Level-set function 614-1 has two values 616. Furthermore, edge 612 may correspond to a mid-point between these two values 616. In contrast, level-set function 614-2 has three values 618, and edge 612 may correspond to value 618-2. While not illustrated in FIG. 6, level-set functions 614 extend into the plane of FIG. 6 (e.g., they may be 3-dimension functions). As is known to one of skill in the art, there are many alternate level-set functions and/or configurations that may be used. For example, in some embodiments one or more separate level-set functions and/or separate patterns or images may be used for the features or defects.

As illustrated by level-set function 614-2, in some embodiments the level-set function may be expressed as a signed distance function relative to the contour or edge 612 (e.g., the value of the level-set function in at least a region is a function of the distance from the edge 612). This formulation may allow effects that occur nearer to the edge 612 to be highlighted. However, because features in photo-masks may occur at random locations (including those far removed from edge 612), level-set function 614-1 may be useful in that it provides an equal weighting with respect to edge 612.

Figure 7:
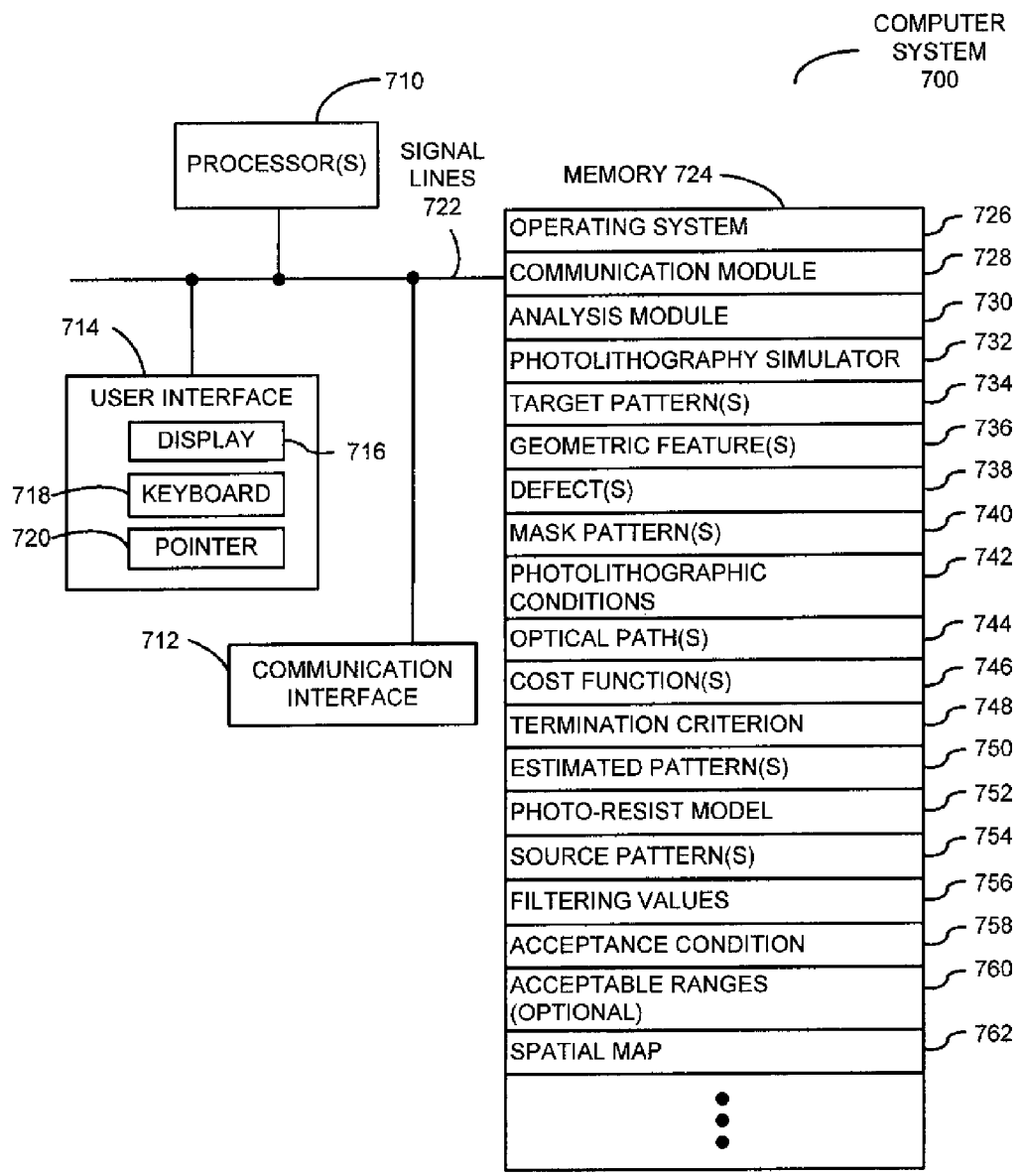
FIG. 7 is a block diagram illustrating a computer system in accordance with an embodiment of the present disclosure.

We now discuss computer systems for implementing the verification technique. FIG. 7 presents a block diagram illustrating a computer system 700. Computer system 700 includes one or more processors 710, a communication interface 712, a user interface 714, and one or more signal lines 722 coupling these components together. Note that the one or more processing units 710 may support parallel processing and/or multi-threaded operation, the communication interface 712 may have a persistent communication connection, and the one or more signal lines 722 may constitute a communication bus. Moreover, the user interface 714 may include a display 716, a keyboard 718, and/or a pointer 720, such as a mouse.

Memory 724 in the computer system 700 may include volatile memory and/or non-volatile memory. More specifically, memory 724 may include ROM, RAM, EPROM, EEPROM, flash, one or more smart cards, one or more magnetic disc storage devices, and/or one or more optical storage devices. Memory 724 may store an operating system 726 that includes procedures (or a set of instructions) for handling various basic system services for performing hardware dependent tasks. The memory 724 may also store procedures (or a set of instructions) in a communication module 728. The communication procedures may be used for communicating with one or more computers and/or servers, including computers and/or servers that are remotely located with respect to the computer system 700.

Memory 724 may also include multiple program modules (or a set of instructions), including: analysis module 730 (or a set of instructions), and/or photolithography simulator 732 (or a set of instructions). Note that one or more of these program modules (or sets of instructions) may constitute a computer-program mechanism. Furthermore, note that one or more of these program modules (or sets of instructions) may be implemented as a stand-alone software application, or as a program module or subroutine in another application.

Figure 8:
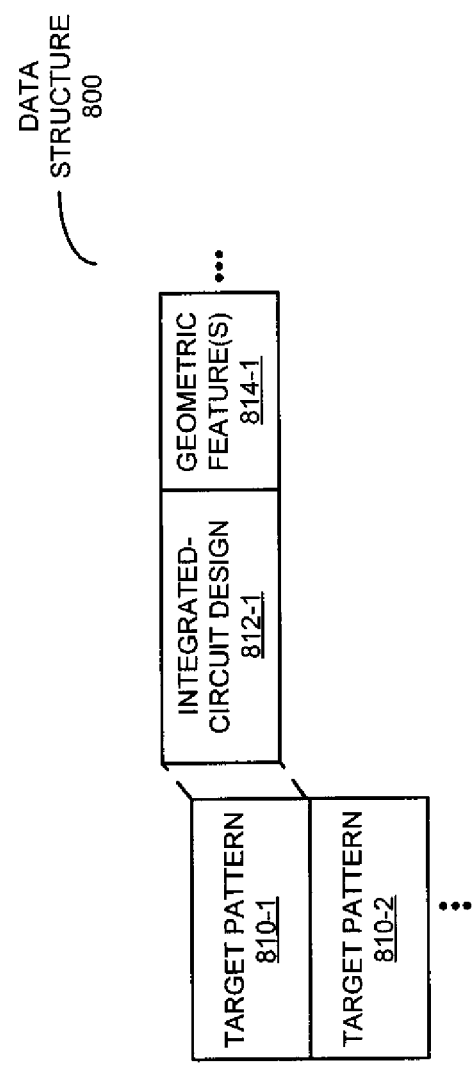
FIG. 8 is a block diagram illustrating a data structure for use in the computer system of FIG. 7 in accordance with an embodiment of the present disclosure.

During operation, computer system 700 may receive one or more target patterns 734 (which include polygons) associated with an integrated-circuit design. Then, analysis module 730 may determine one or more geometric features 736 in the one or more target patterns 734. FIG. 8 presents a block diagram illustrating a data structure 800. This data structure may include target patterns 810 for different integrated-circuit designs. For example, for a given target pattern, such as target pattern 810-1, data structure 800 may include: integrated-circuit design 812-1 and/or geometric features 814-1.

Referring back to FIG. 7, photolithography simulator 732 may subsequently calculate one or more mask patterns 740 that can be used in a photolithographic process (having associated photolithographic conditions 742) to fabricate the one or more target pattern 734 on a semiconductor die, where the one or more mask patterns 740 may be calculated using an inverse optical calculation in which a given one of the one or more target patterns 734 is at an image plane of one of one or more optical paths 744 associated with the photolithographic process and the one or more mask patterns 740 are at an object plane of one of the or more optical paths 744 and are illuminated by one or more source patterns 754 (which may be predefined or which may be calculated by photolithography simulator 732). Next, analysis module 730 may evaluate one or more cost functions 746 to determine if a termination criterion 748 is met, where a given one of the one or more cost functions 746 corresponds to a difference between the one or more target patterns 734 and one or more estimated patterns 750 produced during the photolithographic process at the image plane using the one or more mask patterns 740 at the object plane. If termination criterion 748 is not met, analysis module 730 may modify the one or more mask patterns 740 and repeats the calculation until termination criterion 748 is met.

Note that photolithography simulator 732 may calculate the one or More estimated pattern 750 using the one or more mask patterns 740, at least one of the one or more optical paths 744 and/or a photoresist model 752.

In some embodiments, instead of or after calculating the one or more mask patterns 740, computer system 700 receives (or accesses) the one or more mask patterns 740. Then, photolithography simulator 732 may calculate the one or more estimated patterns 750 at an image plane in the photolithographic process when the one or more mask patterns 740, which are illuminated by the one or more source patterns 754, are at an object plane in the photolithographic process.

Moreover, analysis module 730 may determine or identify defects 738 in the one or more mask patterns 740 based on differences between the one or more estimated patterns 750 and the one or more target patterns 734 that excludes defects 738. Next, analysis module 730 may present defect information to a user, for example, on display 716. For example, analysis module 730 may display a spatial map 762 of defects 738 in one or more mask patterns 740 on display 716.

Alternatively or additionally, analysis module 730 may classify defects 738 by associating defects 738 with types of geometric features 736 in the one or more target patterns 734 and/or the one or more mask patterns 740. Furthermore, analysis module 730 may filter defects 738 associated with geometric features 736 to select a subset of defects 738, where the subset includes defects corresponding to the differences that exceed filtering values 756 that are associated with the types of geometric features 736.

In some embodiments, computer system 700 provides a list of the subset of defects 738 and the associated classifications. In response to providing the list, computer system 700 may receive a revised value of at least one of filtering values 756 from a user of computer system 700.

Additionally, after filtering the defects, analysis module 730 may determine an acceptance condition 758 of at least one of the one or more mask patterns 740. For example, acceptance condition 758 may include a pass or a fail condition. Moreover, determining acceptance condition 758 may involve accessing optional predetermined acceptable ranges 760 of the differences.

Instructions in the various modules in memory 724 may be implemented in a high-level procedural language, an object-oriented programming language, and/or in an assembly or machine language. The programming language may be compiled or interpreted, i.e., configurable or configured to be executed, by the one or more processing units 710.

In some embodiments, at least some of the information in memory 724 is encrypted. For example, the photolithographic simulator 732 and/or its output files may be encrypted. Moreover, information 'stored' in memory 724 in FIG. 7 may be stored locally and/or at remote locations.

Although the computer system 700 is illustrated as having a number of discrete items, FIG. 7 is intended to be a functional description of the various features that may be present in the computer system 700 rather than as a structural schematic of the embodiments described herein. In practice, and as recognized by those of ordinary skill in the art, the functions of the computer system 700 may be distributed over a large number of servers or computers, with various groups of the servers or computers performing particular subsets of the functions. In some embodiments, some or all of the functionality of the computer system 700 may be implemented in one or more ASICs, one or more field programmable gate arrays (FPGAs), and/or one or more digital signal processors (DSPs). In some embodiments the functionality of the computer system 700 may be implemented more in hardware and less in software, or less in hardware and more in software, as is known in the art.

In the preceding discussion, a 'computer system' may include a variety of devices, such as: a personal computer, a laptop computer, a mainframe computer, a portable electronic device, a server and/or a client computer (in a client-server architecture), and/or other device capable of manipulating computer-readable data or communicating such data between two or more computing systems over a network (such as the Internet, an Intranet, a LAN, a WAN, a MAN, or combination of networks, or other technology enabling communication between computing systems).

In some embodiments, forward optical calculation 500 (FIG. 5), mask pattern 600 and corresponding level-set functions 614 (FIG. 6), computer system 700, and/or image data structure 800 (FIG. 8) include fewer or additional components. Furthermore, in these embodiments two or more components are combined into a single component and/or a position of one or more components may be changed.

While the preceding discussion used a photolithography as an illustrative example, in other embodiments the calculation technique may be applied to mask-less lithography. In these embodiments, the inverse optical calculation may be used to determine a write pattern instead of a mask pattern.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for providing a spatial map of defects in at least a portion of a mask pattern, comprising:
   receiving the mask pattern for use in a photolithographic process;
   using the computer, calculating a simulated wafer pattern based on a model of a photoresist used in the photolithographic process, the calculated simulated wafer pattern produced at an image plane in the photolithographic process when at least the portion of the mask pattern, illuminated by an associated source pattern, is at an object plane in the photolithographic process;
   determining the defects in at least the portion of the mask pattern based on differences between the calculated simulated wafer pattern and a target pattern, wherein the target pattern excludes the defects; and
   providing an image of a spatial map for presentation in a graphical user interface associated with a mask-pattern analysis software, the spatial map visually representing the determined defects in at least the portion of the mask pattern.

2. The method of claim 1, wherein the spatial map includes a 2-dimensional map.

3. The method of claim 1, wherein the spatial map indicates defect density.

4. The method of claim 1, wherein the calculated simulated wafer pattern includes an aerial image.

5. The computer-implemented method of claim 1, wherein the spatial map comprises contour lines reflecting defect densities in at least the portion of the mask pattern.

6. The computer-implemented method of claim 1, wherein the spatial map comprises clustered markers reflecting defect densities in at least the portion of the mask pattern.

7. The computer-implemented method of claim 1, further comprising:
   classifying the determined defects based on types of geometric features in at least one of the target pattern and the mask pattern; and
   filtering the determined defects associated with a plurality of the types of geometric features to select a subset of the determined defects.

8. A computer-program product for use in conjunction with a computer system, the computer-program product comprising a non-transitory computer-readable storage medium and a computer-program mechanism embedded therein to provide a spatial map of defects in at least a portion of a mask pattern, the computer-program mechanism including:
   instructions for receiving the mask pattern for use in a photolithographic process;
   instructions for calculating a simulated wafer pattern based on a model of a photoresist used in the photolithographic process, the calculated simulated wafer pattern produced at an image plane in the photolithographic process when at least the portion of the mask pattern, illuminated by an associated source pattern, is at an object plane in the photolithographic process;
   instructions for determining the defects in at least the portion of the mask pattern based on differences between the calculated simulated wafer pattern and a target pattern, wherein the target pattern excludes the defects; and
   instructions for providing an image of a spatial map for presentation in a graphical user interface associated with a mask-pattern analysis software, the spatial map visually representing the determined defects in at least the portion of the mask pattern.

9. The computer-program product of claim 8, wherein the spatial map includes a 2-dimensional map.

10. The computer-program product of claim 8, wherein the spatial map indicates defect density.

11. The computer-program product of claim 8, wherein the calculated simulated wafer pattern includes an aerial image.

12. A computer system for providing a spatial map of defects in at least a portion of a mask pattern, the computer system comprising:
   at least one processor;
   at least one memory; and
   at least one program module, the program module stored in the memory and configured to be executed by the processor, the program module including:

instructions for receiving the mask pattern for use in a photolithographic process;

instructions for calculating a simulated wafer pattern based on a model of a photoresist used in the photolithographic process, the calculated simulated wafer pattern produced at an image plane in the photolithographic process when at least the portion of the mask pattern, illuminated by an associated source pattern, is at an object plane in the photolithographic process;

instructions for determining the defects in at least the portion of the mask pattern based on differences between the calculated simulated wafer pattern and a target pattern, wherein the target pattern excludes the defects; and instructions for providing an image of a spatial map for presentation in a graphical user interface associated with a mask-pattern analysis software, the spatial map visually representing the determined defects in at least the portion of the mask pattern.

13. The computer system of claim 12, wherein the spatial map includes a 2-dimensional map.

14. The computer system of claim 12, wherein the spatial map indicates defect density.

15. A graphical user interface associated with mask-pattern analysis software, comprising:

a window that includes an image of a spatial map presented in the graphical user interface, the spatial map visually representing the determined defects in at least a portion of a mask pattern for use in a photolithographic process, wherein the defects in at least the portion of the mask pattern are determined based on differences between a calculated simulated wafer pattern and a target pattern that excludes the defects; and wherein the calculated simulated wafer pattern is based on a model of a photoresist used in the photolithographic process, the calculated simulated wafer pattern produced at an image plane in the photolithographic process when at least the portion of the mask pattern, illuminated by an associated source pattern, is at an object plane in the photolithographic process.

16. The graphical user interface of claim 15, wherein the spatial map includes a 2-dimensional map.

17. The graphical user interface of claim 15, wherein the spatial map indicates defect density.

* * * * *